(12) United States Patent
Tateda

(10) Patent No.: US 10,738,965 B2
(45) Date of Patent: Aug. 11, 2020

(54) INPUT COMPONENT, SENSOR SHEET, AND DECORATIVE COMPONENT

(71) Applicant: POLYMATECH JAPAN CO., LTD., Saitama (JP)

(72) Inventor: Shinya Tateda, Saitama (JP)

(73) Assignee: SEKISUI POLYMATECH CO., LTD., Saitama (JP)

(*) Notice: Subject to any disclaimer, the term of this patent is extended or adjusted under 35 U.S.C. 154(b) by 227 days.

(21) Appl. No.: 15/313,251

(22) PCT Filed: Jun. 25, 2015

(86) PCT No.: PCT/JP2015/068293
§ 371 (c)(1),
(2) Date: Nov. 22, 2016

(87) PCT Pub. No.: WO2015/199165
PCT Pub. Date: Dec. 30, 2015

(65) Prior Publication Data
US 2017/0184273 A1  Jun. 29, 2017

(30) Foreign Application Priority Data

Jun. 27, 2014 (JP) ................................ 2014-132171
Aug. 26, 2014 (JP) ................................ 2014-172034

(51) Int. Cl.
*F21V 3/04* (2018.01)
*H01H 13/83* (2006.01)
(Continued)

(52) U.S. Cl.
CPC .............. *F21V 3/049* (2013.01); *F21V 11/14* (2013.01); *H01H 13/83* (2013.01); *H03K 17/96* (2013.01);
(Continued)

(58) Field of Classification Search
CPC ......... F21V 3/049; F21V 11/14; H03K 17/96; H03K 2217/960755; H03K 2217/96046; H01H 9/18; H01H 36/00
See application file for complete search history.

(56) References Cited

U.S. PATENT DOCUMENTS 4,449,024 A * 5/1984 Stracener ............. H01H 13/702
200/310
6,762,381 B2 * 7/2004 Kunthady .............. H01H 13/14
200/341
(Continued)

FOREIGN PATENT DOCUMENTS

JP 59-1086 U 1/1984
JP 61-58115 A 3/1986
(Continued)

OTHER PUBLICATIONS

International Search Report for PCT Patent App. No. PCT/JP2015/068293 (dated Aug. 11, 2015).

*Primary Examiner* — Edwin A. Leon
*Assistant Examiner* — Lheiren Mae A Caroc
(74) *Attorney, Agent, or Firm* — Cermak Nakajima & McGowan LLP; Tomoko Nakajima

(57) ABSTRACT

The input component includes a molding that forms an external frame, a sensor sheet formed by providing a sensor electrode on a base sheet formed of a resin film, the sensor sheet being installed inside the molding, a display element capable of being illuminated by an internal light source, a light shielding portion that shields a light from the internal light source, the display element being illuminated when the internal light source is on, a contact with the display element enabling an input operation, a colored transparent layer formed so as to have a color tone that creates a blackout in which the display element becomes integrated with the light shielding portion surrounding the display element when the internal light source is off so as to become difficult to perceive, the colored transparent layer being provided so as to be layered on the display element, and a light diffusing layer.

14 Claims, 17 Drawing Sheets

(51) Int. Cl.
*F21V 11/14* (2006.01)
*H03K 17/96* (2006.01)

(52) U.S. Cl.
CPC . *H01H 2219/034* (2013.01); *H01H 2219/048* (2013.01); *H01H 2219/054* (2013.01); *H01H 2219/056* (2013.01); *H03K 2217/96046* (2013.01); *H03K 2217/960755* (2013.01)

(56) References Cited

U.S. PATENT DOCUMENTS

| | | | |
|---|---|---|---|
| 7,005,596 B2* | 2/2006 | Maeda | H01H 25/041 |
| | | | 200/314 |
| 2005/0103611 A1* | 5/2005 | Holscher | H01H 13/785 |
| | | | 200/310 |
| 2009/0233012 A1* | 9/2009 | Miyauchi | G02B 5/0226 |
| | | | 428/1.33 |
| 2012/0247937 A1* | 10/2012 | Saito | G06F 3/041 |
| | | | 200/512 |
| 2012/0262646 A1 | 10/2012 | Iwata et al. | |
| 2013/0314347 A1* | 11/2013 | Muraoka | H01H 9/02 |
| | | | 345/173 |

FOREIGN PATENT DOCUMENTS

| | | |
|---|---|---|
| JP | 2006-321336 A | 11/2006 |
| JP | 2010-064550 A | 3/2010 |
| JP | 2010-091599 A | 4/2010 |
| JP | 2012-123449 A | 6/2012 |
| JP | 2014-086344 A | 5/2014 |
| WO | WO2011/077742 A1 | 6/2011 |

\* cited by examiner

Fig.3
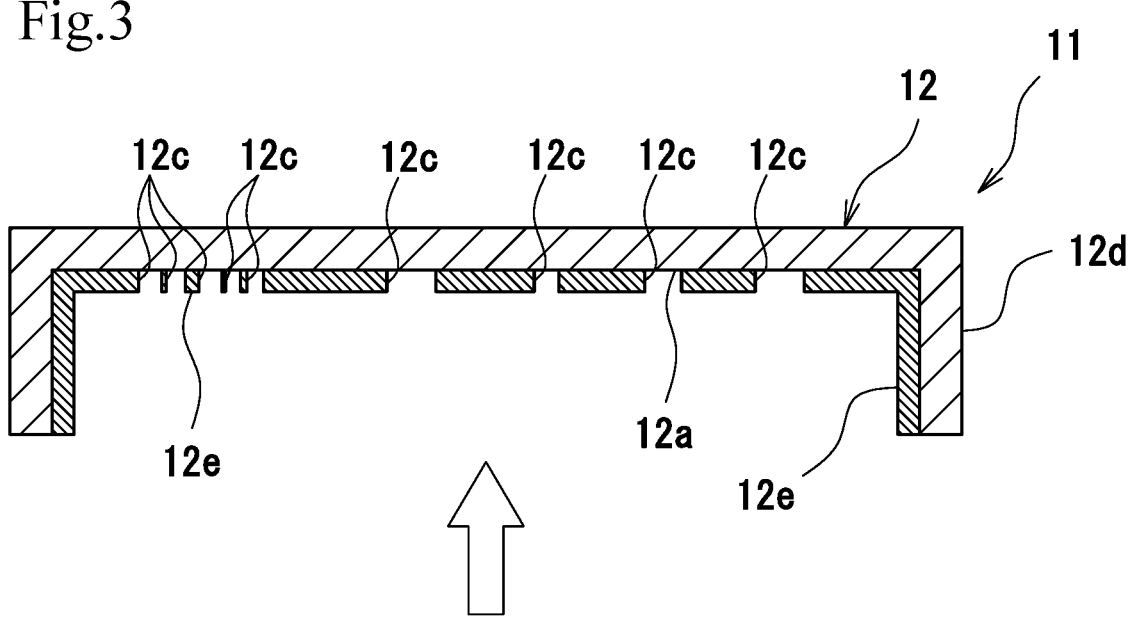
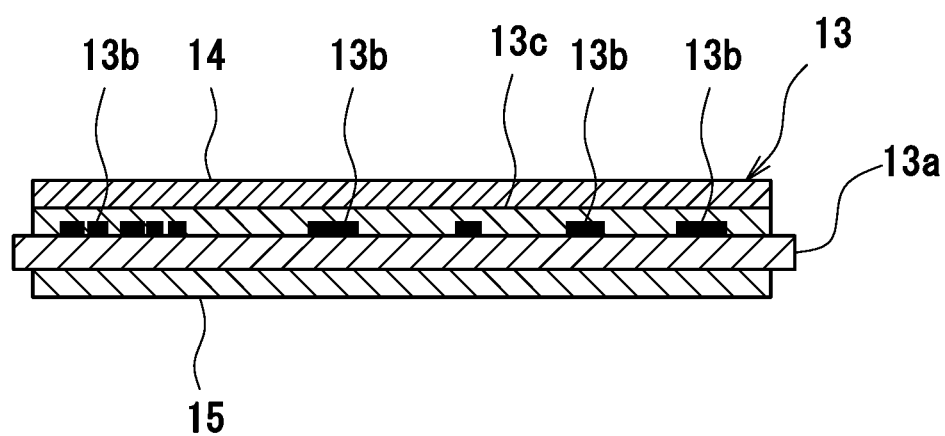
Fig.4
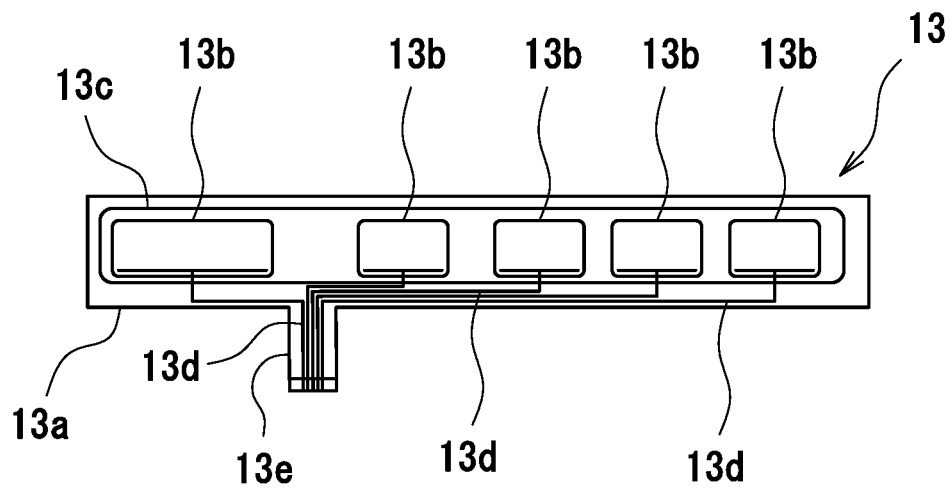

Fig.29

| SAMPLE NUMBER | LAYER 1 (UPPER SURFACE SIDE) | LAYER 2 | LAYER 3 | LAYER 4 | LAYER 5 (UNDERSURFACE SIDE) | VISIBILITY | LIGHT DIFFUSION PROPERTY |
|---|---|---|---|---|---|---|---|
| 1A | | COLORED TRANSPARENT LAYER | SENSOR SHEET BODY | LIGHT DIFFUSING LAYER | | 4 | 5 |
| 1B | | LIGHT DIFFUSING LAYER | SENSOR SHEET BODY | COLORED TRANSPARENT LAYER | | 3 | 2 |
| 2A | COLORED TRANSPARENT LAYER | LIGHT DIFFUSING LAYER | SENSOR SHEET BODY | | | 4 | 2 |
| 2B | | | SENSOR SHEET BODY | LIGHT DIFFUSING LAYER | COLORED TRANSPARENT LAYER | 3 | 3 |
| 3A | | | SENSOR SHEET BODY | COLORED TRANSPARENT LAYER | LIGHT DIFFUSING LAYER | 4 | 4 |
| 3B | LIGHT DIFFUSING LAYER | COLORED TRANSPARENT LAYER | SENSOR SHEET BODY | | | 3 | 2 |
| 4A | | COLORED LAYER + LIGHT DIFFUSING LAYER | SENSOR SHEET BODY | | | 4 | 2 |
| 4B | | | SENSOR SHEET BODY | COLORED LAYER + LIGHT DIFFUSING LAYER | | 4 | 4 |
| 5A | | LIGHT DIFFUSING LAYER | SENSOR SHEET BODY | | | 3 | 2 |
| 5B | | | SENSOR SHEET BODY | LIGHT DIFFUSING LAYER | | 1 | 5 |
| 6A | | COLORED TRANSPARENT LAYER | SENSOR SHEET BODY | | | 5 | 1 |
| 6B | | | SENSOR SHEET BODY | COLORED TRANSPARENT LAYER | | 5 | 1 |

Fig.31

| EVALUATION OF VISIBILITY | | | | | | | |
|---|---|---|---|---|---|---|---|
| TRANSMITTANCE OF COLORED TRANSPARENT LAYER | 80% | 70% | 50% | 35% | 20% | 10% | 3% |
| LIGHT DIFFUSING LAYER A (UNEVEN) | 2 | 3 | 4 | 4 | 4 | 4 | 4 |
| LIGHT DIFFUSING LAYER B (WHITE) | 1 | 1 | 1 | 1 | 1 | 1 | 2 |

Fig.32

| EVALUATION OF BRIGHTNESS OF ILLUMINATION | | | | | | | |
|---|---|---|---|---|---|---|---|
| TRANSMITTANCE OF COLORED TRANSPARENT LAYER | 83% | 70% | 50% | 35% | 20% | 10% | 3% |
| LIGHT DIFFUSING LAYER A (UNEVEN) | ○ | ○ | ○ | ○ | ○ | △ | × |
| LIGHT DIFFUSING LAYER B (WHITE) | ○ | ○ | △ | △ | × | × | × |

INPUT COMPONENT, SENSOR SHEET, AND DECORATIVE COMPONENT

This application is a national phase entry under 35 U.S.C. § 371 of PCT Patent Application No. PCT/JP2015/068293, filed on Jun. 25, 2015, which claims priority under 35 U.S.C. § 119 to Japanese Patent Application Nos. 2014-132171, filed Jun. 27, 2014, and 2014-172034, filed Aug. 26, 2014, all of which are incorporated by reference.

TECHNICAL FIELD

The present invention relates to an input component, a sensor sheet, and a decorative component. In more detail, the present invention is a decorative component in which a display element is illuminated by a light from an internal light source (a backlight) when turned on and that creates a phenomenon (referred to as a "blackout" in the disclosed description and in the claims) in which, when turned off, the display element melts into the background and becomes difficult to perceive. In particular, the present invention relates to a sensor sheet that is provided with a function that achieves the blackout and that is capable of touch input with a finger and the like, and relates to an input component that is provided with the sensor sheet.

BACKGROUND ART

A technique in which a sensor sheet is provided in a control panel of an onboard audio device is described in, for example, Japanese Unexamined Patent Application Publication No. 2012-123449 (Patent Literature 1). In the technique described in the gazette, "a surface coating of gray, black, or the like is applied" (see paragraph [0013]) to the control panel, and in the control panel, "printing indicating the position and function of a switch" (see paragraph [0014]) is performed at a portion corresponding to the switch, such that the printing or the like distinguishes the switch portion and the other portions from each other. Furthermore, a touch panel substrate (a sensor sheet) is disposed inside the control panel in an adhered manner (see paragraph [0015]) such that a predetermined input can be performed through a touch operation.

CITATION LIST

Patent Literature

PTL: Japanese Unexamined Patent Application Publication No. 2012-123449

SUMMARY OF INVENTION

Technical Problem

Incidentally, while not a technique in which a control panel or the like includes a sensor sheet, there is a technique in which an operation portion is illuminated by an internal light source. In such a decorative component that employs such a technique, while the operation portion is illuminated when the internal light source is on, a blackout specification that makes the operation portion inconspicuous when the internal light source is not on is needed. However, in order to illuminate the illuminated portion in a uniform manner, which is a basic illumination quality, typically, a light diffusing layer is provided with a white coating or the like in an inner portion of the illuminated portion. When the internal light source is off, the light diffusing layer stands out, disadvantageously making it difficult to achieve the blackout.

Accordingly, with an object to overcome such a problem, the present invention provides an input component, a sensor sheet, and a decorative component, capable of illuminating a display portion in a bright and uniform manner when the internal light source is on, and that achieves, when the internal light source is off, the blackout specification in which the display portion becomes melted into the background and becomes difficult to perceive.

Solution to Problem

In order to achieve the above object, an input component stated below is provided.

That is, an input component including a sensor sheet including a sensor electrode on a base sheet formed of a resin film, the sensor sheet provided inside a molding to which an input operation is externally applied, a display element capable of being illuminated by an internal light source, a light shielding portion that shields a light from the internal light source, the display element being illuminated when the internal light source is on, a contact with the display element enabling an input operation, a colored transparent layer formed so as to have a color tone that creates a blackout in which the display element becomes integrated with the light shielding portion surrounding the display element when the internal light source is off so as to become difficult to perceive, the colored transparent layer being provided so as to be layered on the display element, and a light diffusing layer that exposes, towards an internal light source side, a surface formed having an uneven surface, the light diffusing layer being provided so as to be layered on the display element.

Since the sensor sheet that includes a sensor electrode on a base sheet formed of a resin film, in which the sensor sheet is provided inside a molding to which an input operation is externally applied, the sensor sheet can be protected with the molding. Furthermore, since the sensor sheet is provided, a so-called touch input can be performed.

Since the display element that can be illuminated by the internal light source, and the light shielding portion that shields the light from the internal light source are formed, and the display element can be illuminated when the internal light source is on, and since an input operation can be performed on the input component by a contact to the display element, the present invention is an input component that has both an illuminating function and an input operation function.

Since the invention includes the colored transparent layer formed so as to have a color tone that creates a blackout in which the display element becomes integrated with the light shielding portion surrounding the display element when the internal light source is off so as to become difficult to perceive, the colored transparent layer being provided so as to be layered on the display element, and includes a light diffusing layer that exposes, towards an internal light source side, a surface formed having an uneven surface, the light diffusing layer being provided so as to be layered on the display element, when the internal light source is on, the light can be transmitted and emitted and can be emitted in an uniform and bright manner. Furthermore, when the internal light source is off, the display element integrating with the light shielding layer and melting into the background can be made difficult to be perceived.

Furthermore, a sensor sheet is provided that is formed by providing a sensor electrode on a base sheet formed of a resin film, the sensor sheet capable of being installed inside a molding including a display element and capable of exerting an input operation upon a contact to a display element that is illuminated by an internal light source that has been turned on and that is provided inside the molding, the sensor sheet including, a colored transparent layer formed so as to have a color tone that creates a blackout in which the display element surrounded by a light shielding portion shielding a light from the internal light source becomes integrated with the light shielding portion when the internal light source is off so as to become difficult to perceive, the colored transparent layer being provided so as to be layered on the display element, and a light diffusing layer that exposes, towards an internal light source side, a surface formed having an uneven surface, the light diffusing layer being provided so as to be layered on the display element is provided.

Furthermore, a decorative component is provided that includes a display element included in a molding, the display element capable of being illuminated by an internal light source, a light shielding portion included in the molding, the light shielding portion shielding a light from the internal light source, the display element being illuminated when the internal light source is on, a colored transparent layer formed so as to have a color tone that creates a blackout in which the display element becomes integrated with the light shielding portion surrounding the display element when the internal light source is off so as to become difficult to perceive, the colored transparent layer being provided so as to be layered on the display element, and a light diffusing layer that exposes, towards an internal light source side, a surface formed having an uneven surface, the light diffusing layer being provided so as to be layered on the display element.

The transmittance of the colored transparent layer may be 10% or higher to 70% or lower. Since the transmittance of the colored transparent layer is 10% or higher to 70% or lower, when the internal light source is on, the light of the internal light source can be transmitted and the display element can be illuminated. Furthermore, when the internal light source is off, the display element integrating with the surroundings of the display element can be made inconspicuous.

The transmittance of the light diffusing layer may be 2.0% or higher. Since the transmittance of the light diffusing layer is 2.0% or higher, the color tone of the light diffusing layer itself can be made almost not visible such that even when the transmittance of the colored transparent layer is high, the color tone of the light diffusing layer can be easily concealed.

An arithmetic average roughness Ra of an unevenness of the surface of the light diffusing layer may be 0.3 μm or larger. Since the arithmetic average roughness Ra of the unevenness of the surface of the light diffusing layer is 0.3 μm or larger, even when the transmittance of the light diffusing layer is increased, the light diffusing property can be prevented from becoming degraded. In other words, the transmittance of the light diffusing layer can be increased. With the above, when the internal light source is off, the light diffusing layer seen through the colored transparent layer can be made difficult to be perceived.

The light diffusing layer and the colored transparent layer may be formed as a same layer. Since the light diffusing layer is also the colored transparent layer, the light diffusing layer and the colored transparent layer do not have to be provided separately and the thickness can be reduced. Furthermore, the number of work processes in manufacturing the product can be reduced.

Advantageous Effects of Invention

The input component, the sensor sheet, and the decorative component of the present invention can achieve the blackout in which the display component melts into the background and becomes difficult to perceive when the internal light source is off, while the display element can be illuminated when the internal light source is on.

BRIEF DESCRIPTION OF DRAWINGS

FIG. 3 is an exploded cross-sectional view of a control panel in FIG. 1 taken along line V-V in FIG. 2.

FIG. 4 is a plan view of a sensor sheet in FIG. 3.

FIG. 29 is a table illustrating layer compositions of the samples of the experimental example 1.

FIG. 31 is a table illustrating evaluations of the visibilities of an experimental example 2.

FIG. 32 is a table illustrating evaluations of the brightness of illumination of the experimental example 2.

DESCRIPTION OF EMBODIMENTS

Figure 1:
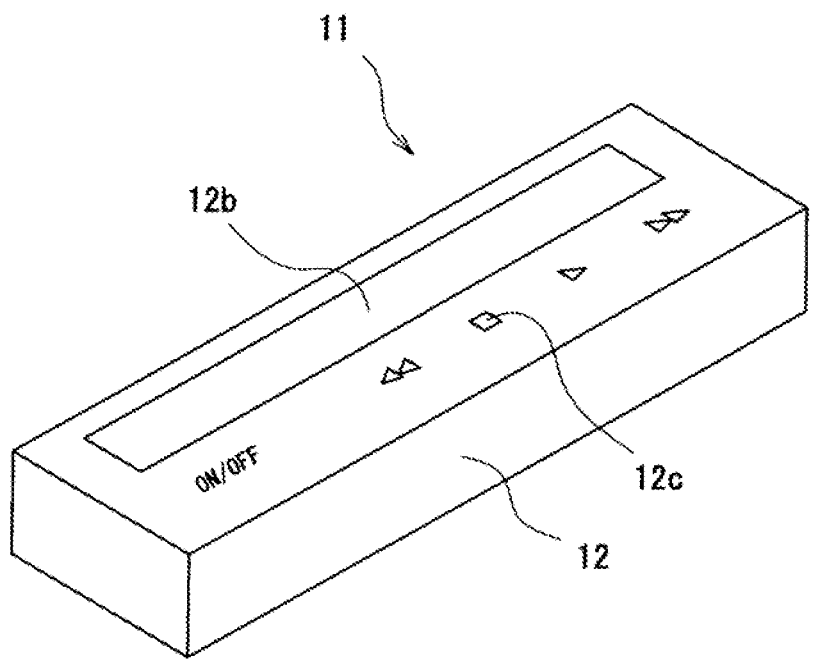
FIG. 1 is a schematic perspective view of a control panel of a first embodiment.

Setting forth the embodiments, the present invention will be described in further detail. Note that members and portions that are common among each of the embodiments will be attached with the same reference numerals and redundant description thereof will be omitted. Furthermore, redundant descriptions of common materials, functions, effects, and the like will be omitted as well.

First Embodiment [FIGS. 1 to 6]

Figure 2:
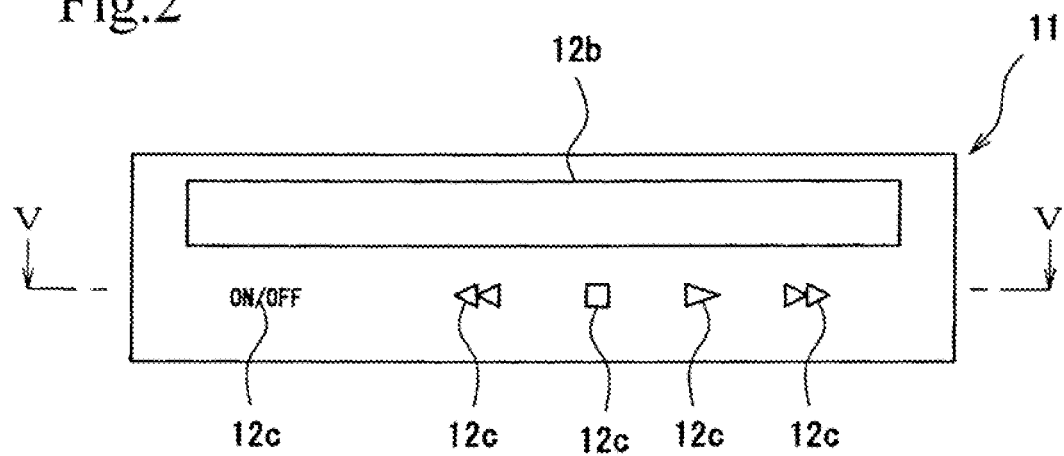
FIG. 2 is a plan view of FIG. 1.

In the present embodiment, a control panel 11 serving as an input component of an audio device will be described. FIG. 1 illustrates a schematic perspective view, FIG. 2 illustrates a plan view, and FIG. 3 illustrates an exploded cross-sectional view of the control panel 11. As illustrated in FIG. 3, the control panel 11 includes a molding 12 that shapes an external form thereof, and a sensor sheet 13 adhered to an inner surface 12a of the molding 12.

A transparent window 12b corresponding to a display, and display elements 12c that are also illuminated areas are provided on a front side of the molding 12.

Furthermore, as illustrated in the exploded cross-sectional view of FIG. 3, the molding 12 is formed of a main body 12d formed of a colorless and transparent resin molding in which light shielding layers 12e are provided on an inner surface 12a thereof at portions other than the window 12b and the display elements 12c. When an internal light source (not shown) provided inside the main body 12d is on, light is shielded at the portions of the light shielding layers 12e and is transmitted through the portions of the display elements 12c allowing the light to be illuminated.

The transparent resin forming the main body 12d of the molding 12 is durable and reliable to serve as the control panel 11 and from the viewpoint of productivity and processability, a thermoplastic resin is suitable for the transparent resin. In particular, an acrylic resin, a polycarbonate resin, a polycarbonate/ABS alloy resin, or the like that has good formability and high transparency is desirably used.

Since the light shielding layers 12e are for preventing the light inside the molding 12 from leaking to the outside, the light shielding layers 12e are formed of a material having a light shielding property. In order to be specified for a blackout, black or a dark color is preferred; however, white or a metallic tone is not excluded and the color tone thereof is not limited to any color tone. Such light shielding layers 12e are, desirably, formed by coating or printing. While the light shielding layers 12e can be formed by directly providing a layer or a plurality of layers on an inner surface of the molding 12 by coating or printing, the light shielding layers 12e may be formed by a method in which the light shielding layers 12e are provided on a transparent resin film by coating or printing, and the resin film is inserted into a mold into which a resin becoming the molding 12 is injected therein such that the molding and the resin film are integrated.

A plan view of the sensor sheet 13 is illustrated in FIG. 4. As illustrated in FIGS. 3 and 4, the sensor sheet 13 includes, in a sensor sheet body 13a, sensor electrodes 13b that are a patterned conductive coating film, and a translucent resist layer 13c that protects the sensor electrodes 13b. Wiring 13d extends from end portions of the sensor electrodes 13b and is connected to a terminal 13e for connecting to a substrate (not shown).

The sensor sheet body 13a is, desirably, formed of a translucent and thermoplastic resin film. It is because a thermoplastic resin can be heated and can be easily molded. The material may include, for example, a polyethylene telephthalate (PET) resin, a polyethylene naphthalate (PEN) resin, a polycarbonate (PC) resin, a polymethyl methacrylate (PMMA) resin, a polypropylene (PP) resin, a polyurethane (PU) resin, a polyamide (PA) resin, a polyethersulfone (PES) resin, a polyetheretherketone (PEEK) resin, a triacetylcellulose (TAC) resin, a polyimide (PI) resin, and a cycloolefin polymer (COP).

While the sensor electrodes 13b are formed of a conductive material, the sensor electrodes 13b are, desirably, formed using an electroconductive polymer. It is because the electroconductive polymer is capable of being formed as a coating liquid in a liquid state and is capable of performing print formation. Furthermore, compared with ITO and the like, the sensor electrodes 13b can be obtained inexpensively.

A type of material in which a transparent layer can be formed is used as the material of the electroconductive polymer, and polyparaphenylene, polyacetylene, poly(3,4-ethylenedioxythiophene) polystyrene sulfonate (PEDOT-PSS), or the like can be illustrated as an example thereof.

Furthermore, as an example of a sensor electrode 13b that do not use an electroconductive polymer, the sensor electrode 13b may be a sensor electrode in which a conductive paste is patterned into a mesh shape, or may be a sensor electrode formed of a transparent conductive layer in which silver nanowires or carbon nanotubes are dispersed.

The layer thickness of the sensor electrode 13 is preferably 0.04 µm to 1.0 µm and, more preferably, is 0.06 µm to 0.4 µm. When the layer thickness is under 0.04 µm, the resistance of the sensor electrode 13 may disadvantageously become high, and when the layer thickness is over 1.0 µm, the transparency becomes low.

The material of the wiring 13d includes, suitably, for example, a conductive paste or a conductive ink that includes a highly conductive metal, such as copper, aluminum, silver, or an alloy including the above metals. Furthermore, owing to the reason that it has the highest conductivity among the above metals and alloys and that it does not easily become oxidized compared with copper, silver wiring is desirable. The wiring 13d at the distal end of the terminal 13e is covered with carbon ink.

A rigid resin is selected as the resin to be the resist layer 13c and, for example, acrylic, urethane, epoxy, or polyolefin resin, or any other resin may be used, and when transparency is required, a resin with transparency is used.

The thickness of the resist layer 13c is about 6 µm to 30 µm and, preferably, is 10 µm to 20 µm. The reason for the above is that when too thick, flexibility disadvantageously becomes poor, and when too thin, the protection of the sensor electrodes 13 disadvantageously becomes insufficient.

In the sensor sheet 13, a colored transparent layer 14 is further layered on an upper surface side thereof and, furthermore, a light diffusing layer 15 is layered on an under-surface side thereof.

When the sensor sheet 13 is adhered to the molding 12, the colored transparent layer 14 constitutes a color appearance of the display elements 12c. Accordingly, the colored transparent layer 14 needs to cover the display elements 12c from the inner side.

As illustrated in FIG. 3, when the colored transparent layer 14 is provided so as to cover the entire sensor electrodes 13b, since no steps will be created on the surface of the sensor sheet 13, bubbles caused by the steps can be prevented from becoming mixed. While the colored transparent layer 14 and the light diffusing layer 15 are both formed so as to cover substantially the entire sensor sheet body 13a in the above manner, it is only sufficient that the two layers are provided at least at the positions corresponding to the sensor electrodes 13b and the display elements 12c. It is because the portions of the molding 12 corresponding to the sensor electrodes 13b become the input operation portions, and the input operation portions also correspond to the display elements 12c that become the illuminated portions.

Since the colored transparent layer 14 transmits the light from the internal light source (not shown) inside the molding 12, the colored transparent layer 14 is required to be translucent. Furthermore, when the internal light source is off, a certain degree of opaqueness is required so that the inside of the molding 12 cannot be seen and, furthermore, it is required that the color is substantially the same as the color of the light shielding layers 12e so that the display elements 12c becomes integrated with and does not stand out with respect to the surroundings.

The relationship between the translucency and the opaqueness of the colored transparent layer 14 is preferably 10% or higher to 70% or lower and, more preferably, is 20% or higher to 50% or lower in a parallel light transmittance of a light with a wave length of 550 nm when measured with a spectrophotometer. It is because in the range of 20% or higher to 50% or lower, the quality of the blackout and the brightness of illumination can both be maintained at a high level. However, when the transmittance is under 10%, since the light is shielded excessively, the illumination brightness may disadvantageously become low. Furthermore, when the transmittance is over 70%, the opaqueness decreases and the unevenness of the light diffusing layer 15 may disadvantageously become visible. Note that the colored transparent layer 14 can be formed with a material having a light diffusion property; however, in such a case, the parallel light transmittance described above can be replace with total light transmittance.

The colored transparent layer 14 can be formed by coating or printing, and is desirably formed by screen printing due to its productivity and the easiness in material adjustment.

The light diffusing layer 15 is provided between the internal light source inside the molding 12 and the display elements 12c so that the light diffusing layer 15 is provided to refract and irregularly diffuse the light from the internal light source in order to emit a uniform light from the display elements 12c. Accordingly, the light diffusing layer 15 is to have a high transmittance and is provided with an unevenness on the surface. The transmittance of the light diffusing layer 15 is preferably 0.5% or higher and, more preferably, is 2.0% or higher. When the transmittance is under 0.5%, the color tone of the light diffusing layer 15 itself becomes dark and becomes difficult to conceal with the colored transparent layer 14. When the transmittance is 2.0% or higher, the color tone of the light diffusing layer 15 does not stand out and even when the transparency of the colored transparent layer 14 is increased, the blackout specification can be met easily.

When the transmittance, as an upper limit, exceeds 80%, the light diffusion property becomes insufficient and, disadvantageously, the light may not be emitted uniformly. Note that the above-described transmittance of the light diffusing layer 15 is also a parallel light transmittance of a light having a wavelength of 550 nm when measured with a spectrophotometer. In total light transmittance, 50% or higher is preferable.

A colorless light diffusing layer 15 is especially desirable; however, when not colorless, it is desirable that the color is similar to that of the colored transparent layer 14.

The unevenness of the surface of the light diffusing layer 15 is preferably 0.3 μm or larger in arithmetic average surface roughness Ra specified in JIS B0601. It is because when Ra is smaller than 0.3 μm, the light diffusion property is poor and, disadvantageously, the light may not be emitted uniformly. Regarding an upper limit of the Ra value, the value of the Ra is preferably 50 μm or smaller since the unevenness is required to be small enough such that each uneven reflecting surface cannot be visually recognized.

The light diffusing layer 15 can be formed by coating or printing, and is desirably formed by screen printing due to its productivity and the easiness in material adjustment. Desirably, a coating liquid containing a transparent filling material having a grain size of about 1 μm to 100 μm is used. By coating or printing such a coating liquid, the light diffusing layer 15 that is provided with an unevenness and that has a surface roughness described above can be formed. Alternatively, the light diffusing layer 15 may be formed with a method performing embossing.

Figure 5:
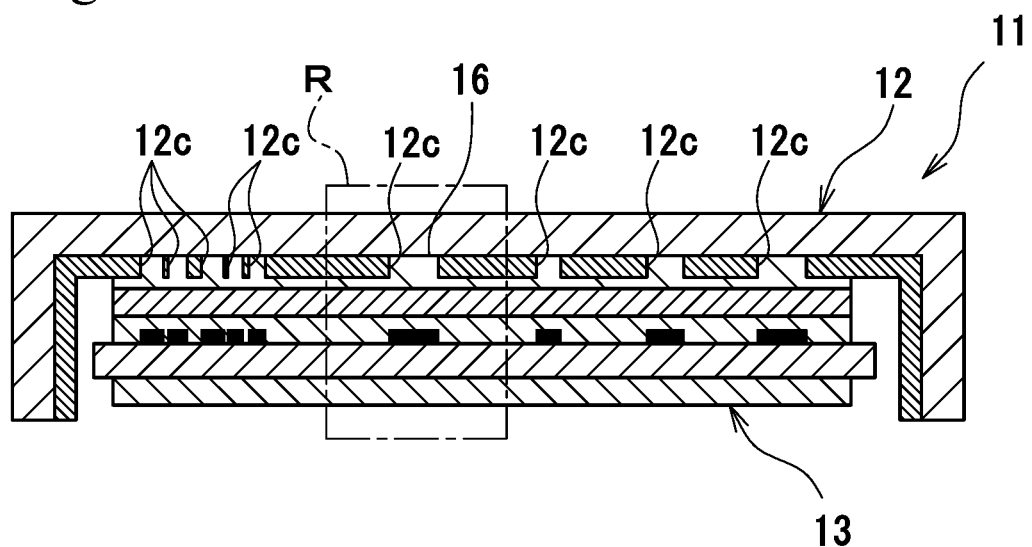
FIG. 5 is a cross-sectional view taken along line V-V in FIG. 2.

FIG. 5 is a cross-sectional view of the control panel 11 in which the molding 12 and the sensor sheet 13 has been integrated. The molding 12 and the sensor sheet 13 illustrated in FIG. 3 are, as illustrated in FIG. 5, integrated by interposing an adhesion layer 16 in between. While a liquid adhesive or a double-sided adhesive tape can be used as the adhesion layer 16, desirably, a double-sided adhesive tape that can easily make the thickness uniform is used. Desirably, the adhesion layer 16 is formed so as to fill the gap created between the light shielding layers 12e.

Figure 6:
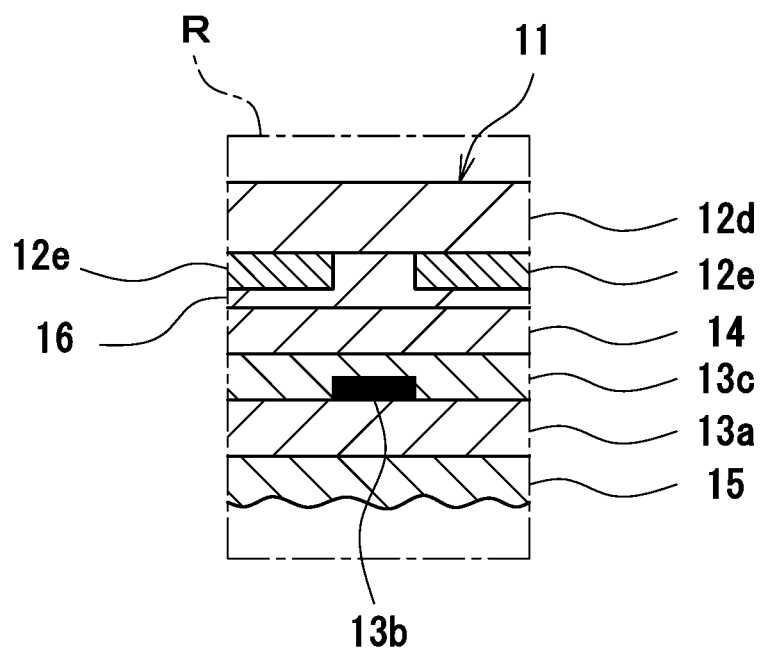
FIG. 6 is a partially enlarged cross-sectional view of a portion R in FIG. 5.

FIG. 6 is a partially enlarged cross-sectional view in which portion R surrounded by a dot and dash line in FIG. 5 has been enlarged and is a diagram illustrating a structure of the lamination of the control panel 11. As illustrated in FIG. 6, when the layer compositions of the control panel 11 are arranged together, the colored transparent layer 14 is provided on the upper surface side (the front side of the control panel 11) of the sensor sheet 13, and the light diffusing layer 15 is provided on the undersurface side (the back side of the control panel 11).

In order to make the internal light source emit light in a uniform manner, one may conceive of applying a conventional technique and form a light diffusing layer on the inner surface 12a of the molding 12; however, in the present invention that uses the sensor sheet 13, when the sensor sheet 13 is adhered to the inner surface 12a of the molding 12, the unevenness of the light diffusing layer becomes covered and the light diffusion property becomes impaired. Accordingly, the light diffusing layer cannot be provided on the inner surface 12a of the molding. However, by providing the light diffusing layer 15 on the undersurface of the sensor sheet 13, a sufficient light diffusing effect can be exerted without damaging the unevenness of the light diffusing layer even when the transparency is increased.

Furthermore, since the transmittance of the light diffusing layer 15 increases, the diffusion of light caused by the color tone of the light diffusing layer 15 and by external light can be concealed even when the transmittance of the colored transparent layer 14 increases. Furthermore, since the transparency of the colored transparent layer 14, as well as the transparency of the light diffusing layer 15, can be increased, an emission of a bright light can be performed.

Modifications 1 to 7 [FIGS. 7 to 13]:

Regarding the position in which the colored transparent layer 14 is provided, various modified embodiments as described below can be employed.

(1) Providing Colored Transparent Layer 14 on Molding 12

In the control panel 11 described above, the colored transparent layer 14 is provided on the upper surface of the sensor sheet 13; however, changing from the above mode, a mode in which the colored transparent layer 14 is provided on the inner surface 12a of the molding 12 may be adopted.

In a case in which the colored transparent layer 14 is provided in the molding 12, the colored transparent layer 14 may be provided on a surface below the light shielding layer 12e or may be provided on a surface thereabove.

Figure 7:
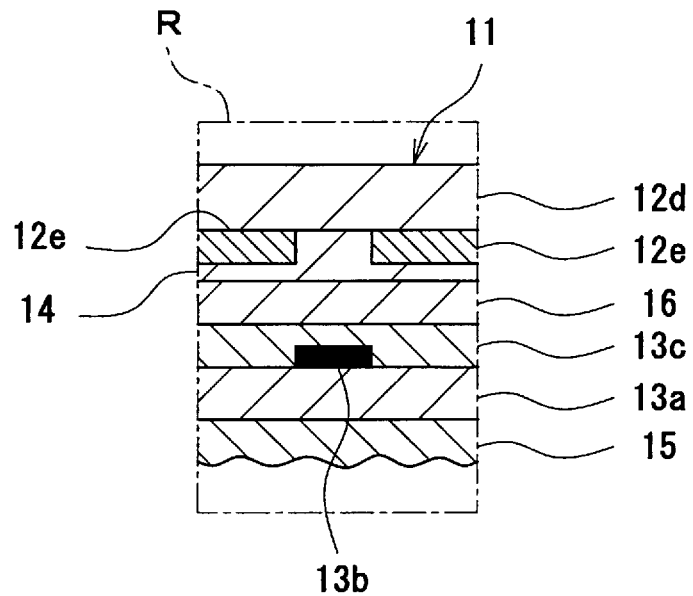
FIG. 7 is a diagram of modification 1 of the first embodiment, corresponding to FIG. 6.

FIG. 7 illustrates a case in which the colored transparent layer 14 is provided on a surface below the light shielding layer 12e. In such a case, steps each created at a boundary between the region where the light shielding layer 12e is provided and the region where the light shielding layer 12e is not provided can be filled with the colored transparent layer 14, and generation of bubbles that are easily mixed if there is a step when adhering the sensor sheet 13 can be suppressed.

Figure 8:
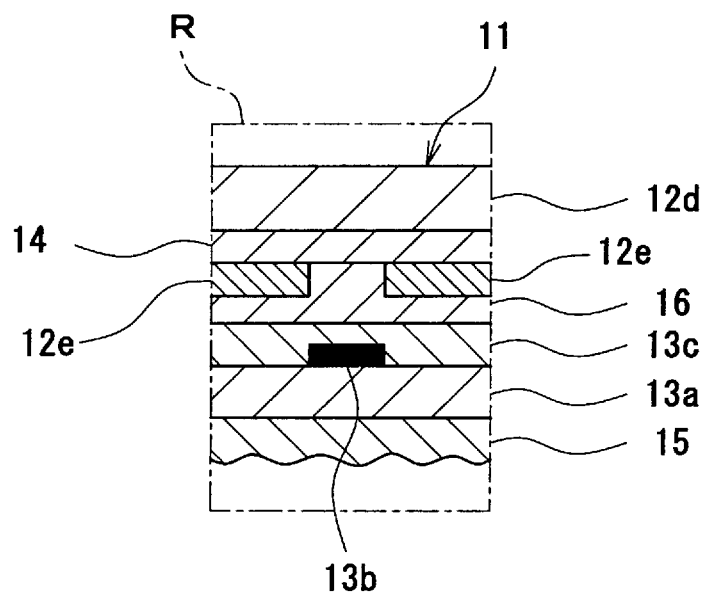
FIG. 8 is a diagram of modification 2 of the first embodiment, corresponding to FIG. 6.

FIG. 8 illustrates a case in which the colored transparent layer 14 is provided on a surface above the light shielding layer 12e. In such a case, since the colored transparent layer 14 has opaqueness, there is an advantage in that the difference in the color tones is not easily perceived even in a case in which the color tones of the light shielding layer 12e and the colored transparent layer 14 are slightly different.

Figure 9:
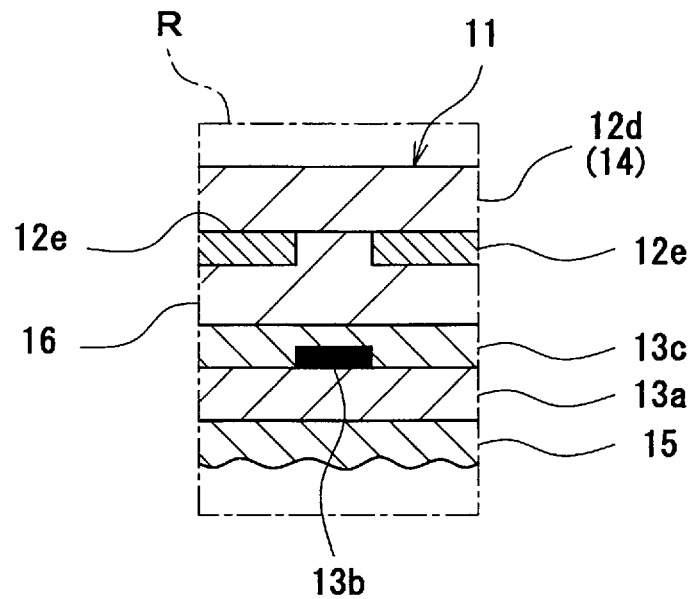
FIG. 9 is a diagram of modification 3 of the first embodiment, corresponding to FIG. 6.

FIG. 9 illustrates a case in which the molding 12 itself is the colored transparent layer 14. In other words, in the example described above, while the molding 12 is formed of a transparent resin molding, if the molding 12 is colored so as to have a predetermined translucency and opaqueness, the molding 12 itself can serve as the colored transparent layer 14. Since there is no need to separately form the colored transparent layer 14, the manufacturing processes can be reduced and the cost can be reduced.

(2) Providing Colored Transparent Layer 14 on Sensor Sheet 13

Figure 10:
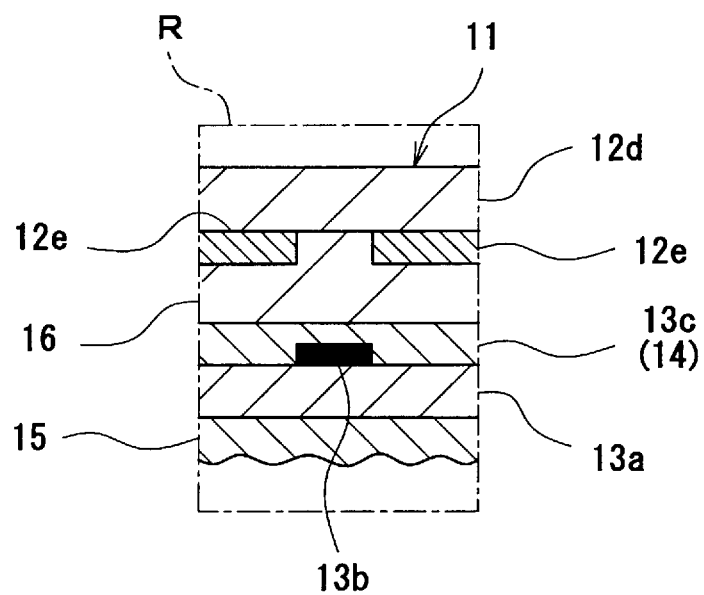
FIG. 10 is a diagram of modification 4 of the first embodiment, corresponding to FIG. 6.

In the example described with the embodiment described above, the colored transparent layer 14 is provided on the upper surface of the sensor sheet 13; however, changing from the above mode, as illustrated in FIG. 10, the resist layer 13c constituting the sensor sheet 13 may be the colored transparent layer 14.

In other words, by coloring the resist layer 13c to have a predetermined translucency and opaqueness, the resist layer 13c can also serve as the colored transparent layer 14 and there is no need to separately form the colored transparent layer 14. Accordingly, the manufacturing processes can be reduced and the cost can be reduced.

Figure 11:
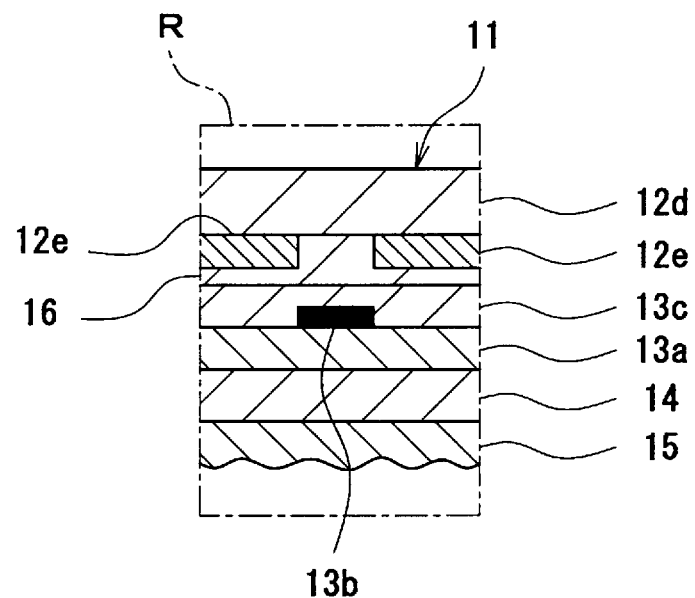
FIG. 11 is a diagram of modification 5 of the first embodiment, corresponding to FIG. 6.

As a different mode, as illustrated in FIG. 11, the colored transparent layer 14 may be provided on the undersurface of the sensor sheet 13. In such a case, the colored transparent layer 14 is layered on the sensor sheet body 13a and, further, the light diffusing layer 15 is layered thereon.

Figure 12:
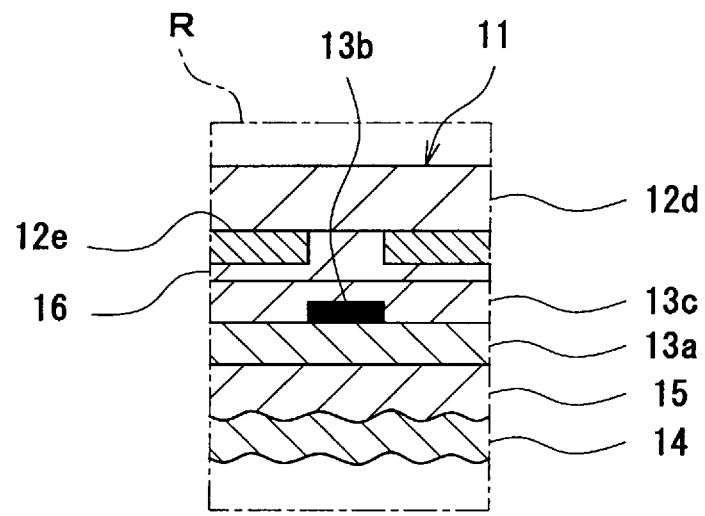
FIG. 12 is a diagram of modification 6 of the first embodiment, corresponding to FIG. 6.

On the other hand, as illustrated in FIG. 12, the light diffusing layer 15 and the colored transparent layer 14 may be, in this order, layered on the sensor sheet body 13a.

However, since the uneven surface needs to be exposed on the internal light source side, that is, on the undersurface side, in the above case, it can be understood that the two types of layers, namely, the light diffusing layer 15 and the colored transparent layer 14 function as a single layer such that a "colored light transmitting layer" is formed.

(3) Providing Colored Transparent Layer 14 on Light Diffusing Layer 15

Figure 13:
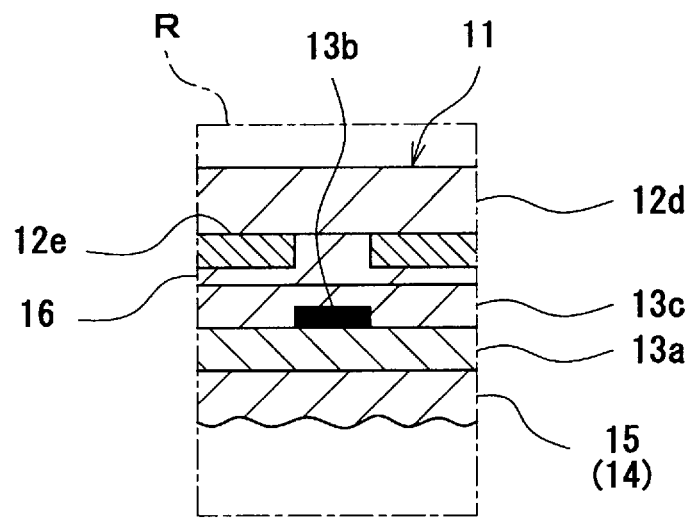
FIG. 13 is a diagram of modification 7 of the first embodiment, corresponding to FIG. 6.

As illustrated in FIG. 13, the light diffusing layer 15 may be colored to have a predetermined translucency and opaqueness to serve also as the colored transparent layer 14. In other words, a colored transparent light diffusing layer that is a layer in which the colored transparent layer 14 and the light diffusing layer 15 are integrated may be formed. In FIG. 12, a single colored transparent light diffusing layer is formed with two different layers; however, here, a single layer forms a colored transparent light diffusing layer. The blackout specification can be met and light can be emitted brightly even with the above. The reason for the above is as follows.

First, the light from the internal light source is incident on the uneven surface and is diffused and, after that, reaches the upper surface side through the thickness. Accordingly, there is hardly any difference in light absorption between a case in which the light diffusing layer 15 is colored and a case in which a colored transparent layer 14 is provided separately, and the light diffusing effect and the brightness of illumination are similar. Furthermore, it is because the unevenness can be concealed through the colored thickness of the light diffusing layer 15 when viewing the display elements 12c from the upper surface side in a case in which the light is not on.

Figure 14:
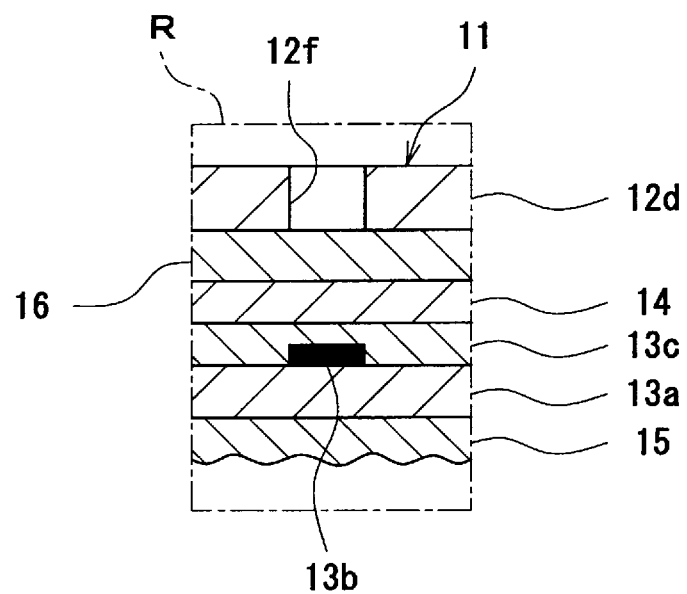
FIG. 14 is a diagram of another modification of the first embodiment, corresponding to FIG. 6.
Figure 15:
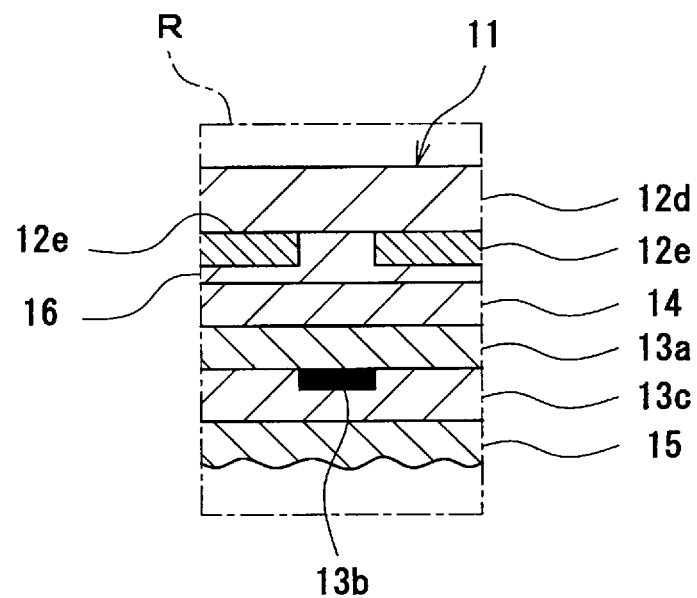
FIG. 15 is a diagram of further another modification of the first embodiment, corresponding to FIG. 6.

Other Modifications [FIGS. 14 to 15]:

Other than the above, various modifications can be made, and as an example, as illustrated in FIG. 14, a light shielding molding 12 may be used in place of the transparent molding 12. In other words, the main body 12d of the molding 12 may be formed of colored resin. With such a configuration, the portions that is to be the display elements 12c needs to be provided by penetrating therethrough through holes 12f.

Furthermore, as another example, changing from a mode in which the light shielding layer 12e is provided in the molding 12, the light shielding layer 12e may be provided on the surface of the sensor sheet 13.

As a further example, instead of using the adhesion layer 16 to integrate the molding 12 and the sensor sheet 13, integration may be performed by insertion inside the mold of the sensor sheet 13 and injection molding the molding 12.

As a still another example, the configuration may be such that the molding 12 and the sensor sheet 13 are not fixed to each other and that the sensor sheet 13 is held between the molding 12 and a press part prepared separately from the molding 12.

Alternatively, instead of the mode in which the colored transparent layer 14 are provided on a surface on which sensor electrodes 13b and the like of the sensor sheet body 13a are provided, and the light diffusing layer 15 is provided on the other surface, as illustrated in FIG. 15, the light diffusing layer 15 may be provided on a surface on which the sensor electrodes 13b and the like are provided, and the colored transparent layer 14 may be provided on the other surface. In other words, instead of providing the sensor electrodes 13b and the like on the sensor sheet body 13a on the upper surface side of the control panel 11, the sensor electrodes 13b and the like may be provided on the undersurface side of the control panel 11.

Figure 16:
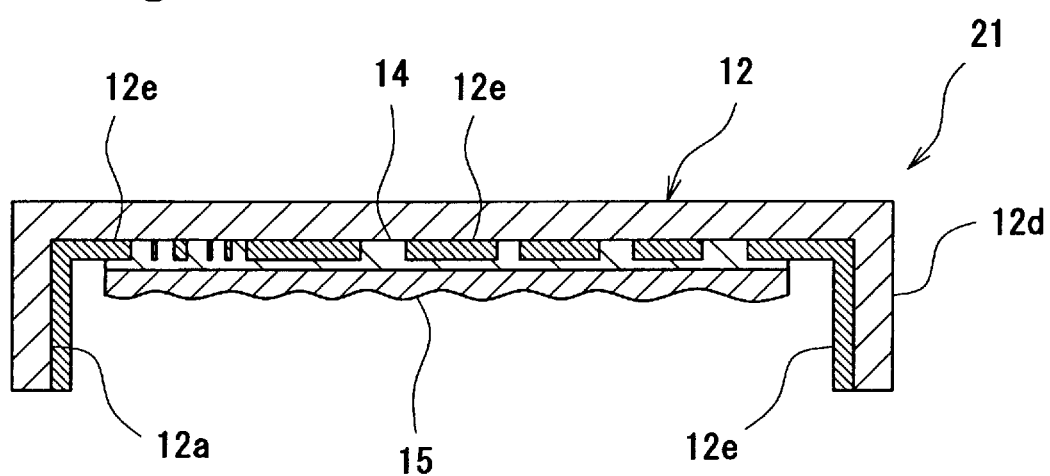
FIG. 16 is a cross-sectional view of a display panel of a second embodiment, corresponding to FIG. 5.

Second Embodiment [FIG. 16]

In the present embodiment, a display panel 21 serving as a decorative component of an audio device will be described. The display panel 21 of the present embodiment is different from the control panel 11 described in the previous embodiment in that the display panel 21 does not include the sensor sheet 13 and does not have an input function. The appearance of the display panel 21 is the same as that of the control panel 11, and is illustrated in the same manner as that in FIGS. 1 and 2.

In other words, the display panel 21 is configured so as to include the molding 12 that forms the external form of the display panel 21 and, more specifically, as illustrated in FIG. 16, the display panel 21 is provided with the light shielding layers 12e on the inner surface 12a of the molding 12 at portions other than where the display elements 12c and the window 12b are formed. Furthermore, including the portions of the display elements 12c, the colored transparent layer 14 and the light diffusing layer 15 are, in this order, layered on the inner surface 12a of the molding 12.

Such a display panel 21 may be one in which the display elements 12c emit light in a uniform manner when the internal light source (not shown) provided inside the molding 12 is lit up, and in which the display elements 12c, the display elements 12c melting into the background, is not easily viewed when the internal light source is off.

Figure 17:
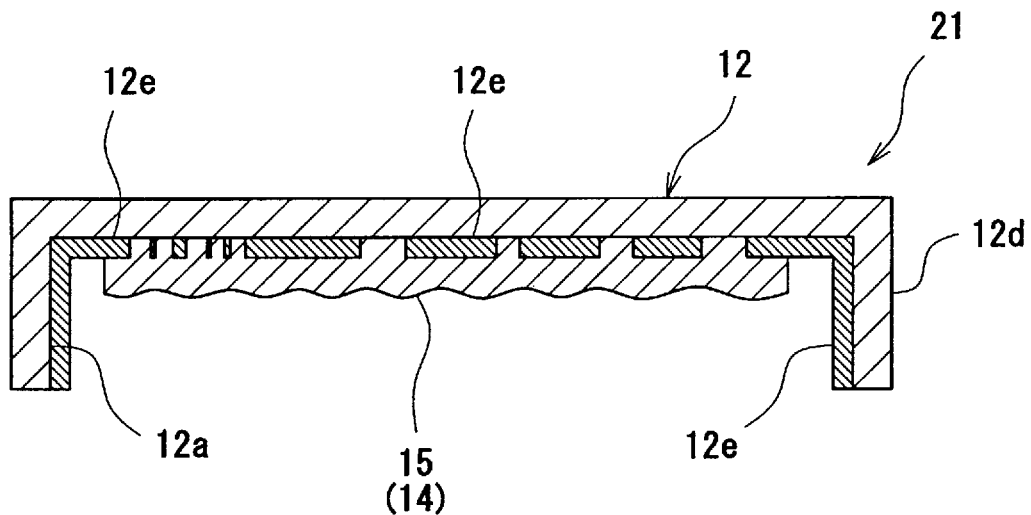
FIG. 17 is a diagram of modification 1 of the second embodiment, corresponding to FIG. 16.
Figure 18:
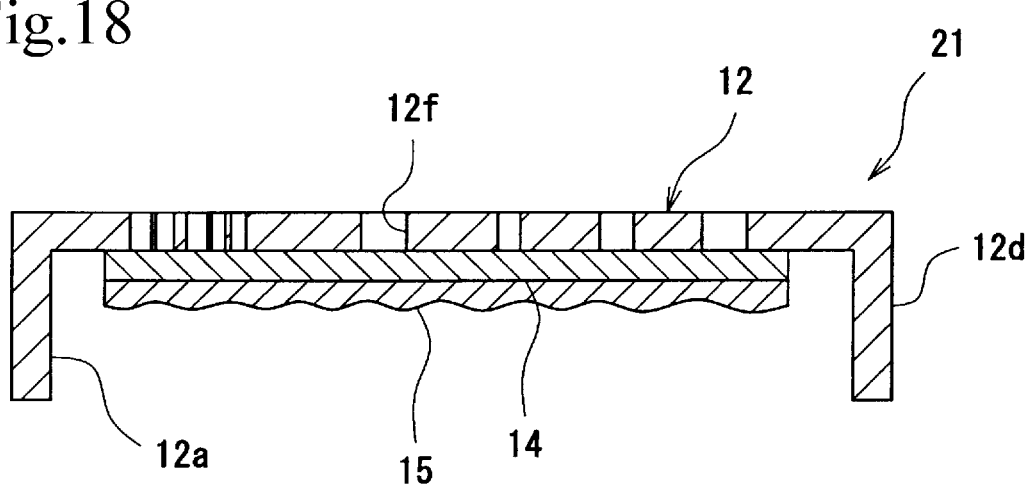
FIG. 18 is a diagram of modification 2 of the second embodiment, corresponding to FIG. 16.

Modifications [FIGS. 17 and 18]:

As illustrated in FIG. 17, the light diffusing layer 15 and the colored transparent layer 14 can be integrated by having the light diffusing layer 15 be provided with the predetermined translucency and opaqueness that the colored transparent layer 14 bears. The parallel light transmittance of such a light diffusing layer 15 is also preferably 0.5% to 20%.

As illustrated in FIG. 18, similar to the previous embodiment, the light shielding molding 12 can be used as well. Furthermore, in the present embodiment, since there is not sensor sheet 13 and an electrostatic interaction can be ignored, the molding 12 can be formed of a metal material.

The embodiments described above are examples and the present invention is not limited to the embodiments and includes any modifications of the shapes, materials, the manufacturing method, and the like of each member that are within the scope of the present invention.

EXAMPLES

Experimental Example 1

Samples that conform the configurations of the control panels (11) illustrated in the embodiments were fabricated and the visibilities and the light diffusion properties were evaluated. Regarding the visibility, an ultraviolet and visible spectrophotometer (manufactured by Shimadzu Corporation, "UV-1600") was used to measure the transmittance. As for the transmittance, a measurement of a wavelength of 550 nm was employed. Furthermore, regarding the light diffusion property, a laser microprobe (manufactured by Keyence Corporation"UK-8510") was used to measure the arithmetic average surface roughness Ra.

<Sample 1A>: Light shielding layers (12e) were printed with a black light shielding polyester ink on a printing transparent polyethylene telephthalate resin film except at portions that become the display elements (12c). Subsequently, the above was inserted into a mold and a transparent polycarbonate resin was injection molded. Accordingly, light shielding layers (12e) were provided on a surface of a molding (12) formed of polycarbonate resin.

Meanwhile wiring (13d) was formed with silver ink, sensor electrodes (13b) were formed with transparent conductive ink, a resist layer (13c) was formed with polyurethane ink in this order on one of the surfaces of another transparent polyethylene telephthalate resin film by coating. Furthermore, as a filler for forming unevenness on the surface, a light diffusing layer (15) was formed by printing with polyester ink containing silica with a grain size of 2 μm. Furthermore, a colored transparent layer (14) was formed on the other surface of the polyethylene telephthalate resin film by printing with black transparent polyester ink. A sensor sheet (13) was fabricated in the above manner.

Note that as for the colored transparent layer (14), the layer thickness was 6 μm and the transmittance was 50%. Furthermore, as for the light diffusing layer (15), the transmittance was 4.0% and the arithmetic surface roughness Ra of the surface was 0.63 μm.

A sample 1A with a configuration illustrated in FIG. 15 was obtained by adhering the sensor sheet (13) to the molding body 12 with a transparent double-sided adhesive tape adhered to a surface provided with the colored transparent layer (14).

Figure 19:
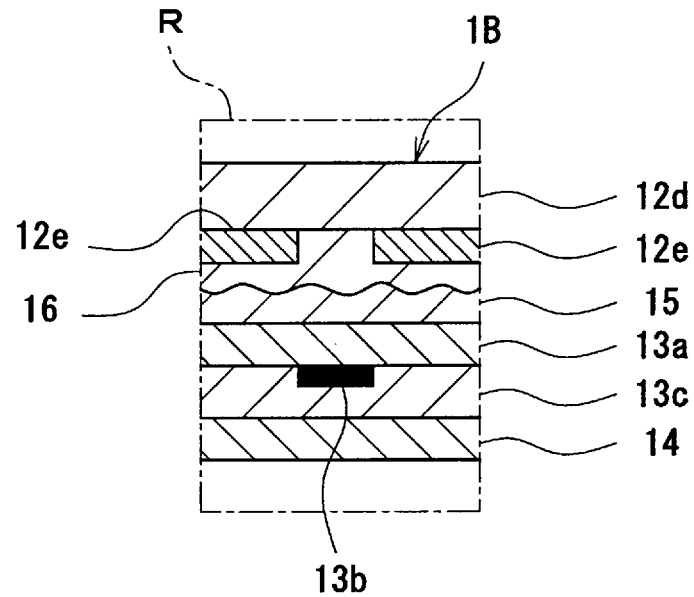
FIG. 19 is a diagram of sample 1B of experimental example 1, corresponding to FIG. 16.

<Sample 1B>: A molding (12) and a sensor sheet (13) having configurations similar to that of sample 1A were fabricated. The sensor sheet (13) obtained in the above manner was adhered to the molding (12) by adhering, opposite to sample 1A, a double-sided adhesive tape to the surface provided with the light diffusing layer (15). Sample 1B with a configuration illustrated in FIG. 19 was obtained in the above manner.

The arithmetic surface roughness Ra of the colored transparent layer (14) constituting the undersurface of the sample was 0.23 μm.

Figure 20:
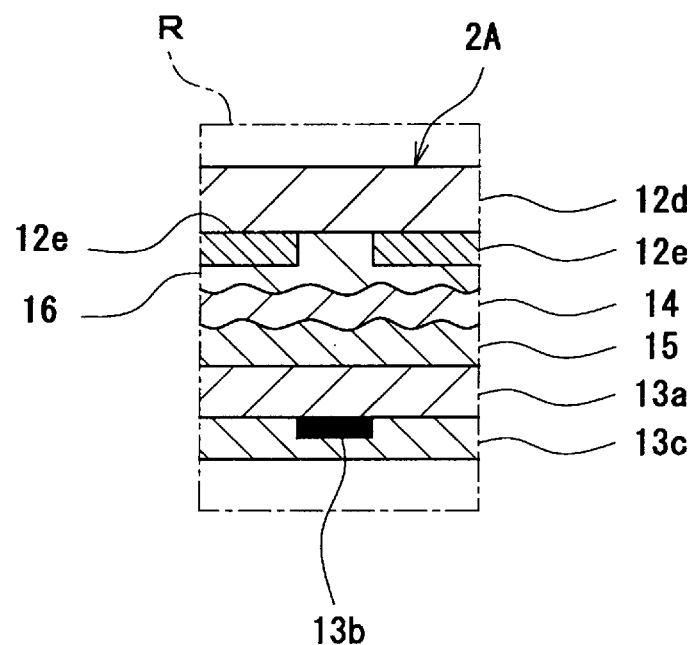
FIG. 20 is a diagram of sample 2A of the experimental example 1, corresponding to FIG. 16.

<Sample 2A>: A light diffusing layer (15) was formed on a surface of a sensor sheet body (13a) opposite a surface on which a resist layer (13c) had been formed and, furthermore, a colored transparent layer (14) was formed thereon. Other than the above was similar to sample 1A, and sample 2A with a configuration illustrated in FIG. 20 was obtained.

An arithmetic surface roughness Ra of a surface of a resist layer (13c) of the sensor sheet body (13a), the surface being an undersurface of sample 2A, was 0.21 μm.

Figure 21:
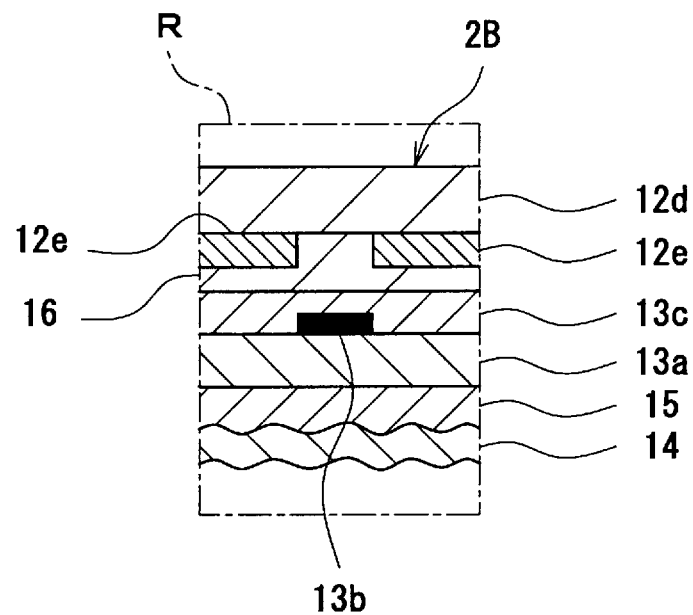
FIG. 21 is a diagram of sample 2B of the experimental example 1, corresponding to FIG. 16.

<Sample 2B>: Other than adhering, with a double-sided adhesive tape, a surface of a sensor sheet body (13a) opposite to a surface provided with a colored transparent layer (14) to a molding 12, sample 2B configured in FIG. 21 was obtained in a manner similar to that of sample 2A.

Furthermore, the arithmetic surface roughness Ra of the surface of the colored transparent layer (14), the surface being an undersurface of sample 2B, was 0.34 μm.

<Sample 3A>: A colored transparent layer (14) was formed on a surface of a sensor sheet body (13a) opposite a surface on which a resist layer (13c) had been formed and, furthermore, a light diffusing layer (15) was formed thereon. Furthermore, other than adhering a surface provided with a resist layer (13c) to a molding (13), sample 3A with a configuration illustrated in FIG. 11 was obtained in a manner similar to that of sample 1A. The arithmetic surface roughness Ra of the surface of the light diffusing layer (15), the surface being an undersurface of sample 3A, was 0.46 μm.

Figure 22:
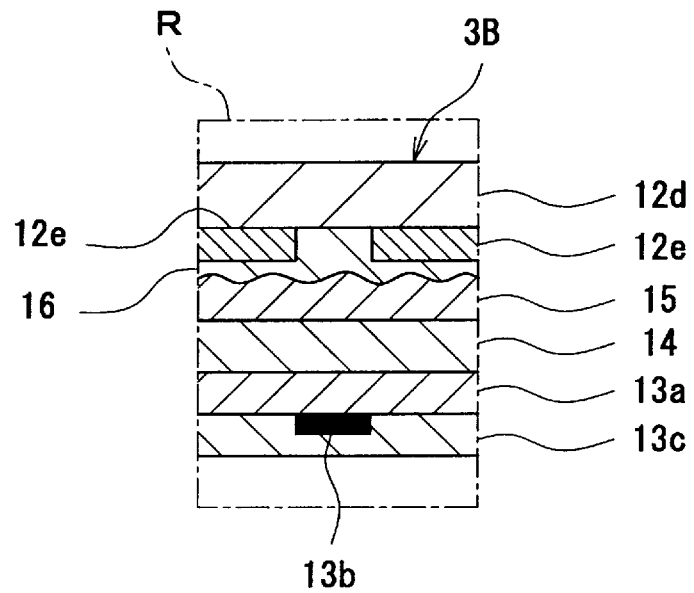
FIG. 22 is a diagram of sample 3B of the experimental example 1, corresponding to FIG. 16.

<Sample 3B>: Other than adhering, with a double-sided adhesive tape, a surface of a sensor sheet body (13a)

opposite to a surface provided with a resist layer (13c) to a molding 12, sample 3B configured in FIG. 22 was obtained in a manner similar to that of sample 3A. The arithmetic surface roughness Ra of the surface of the resist layer (13c), the surface being an undersurface of sample 3B, was 0.21 μm.

Figure 23:
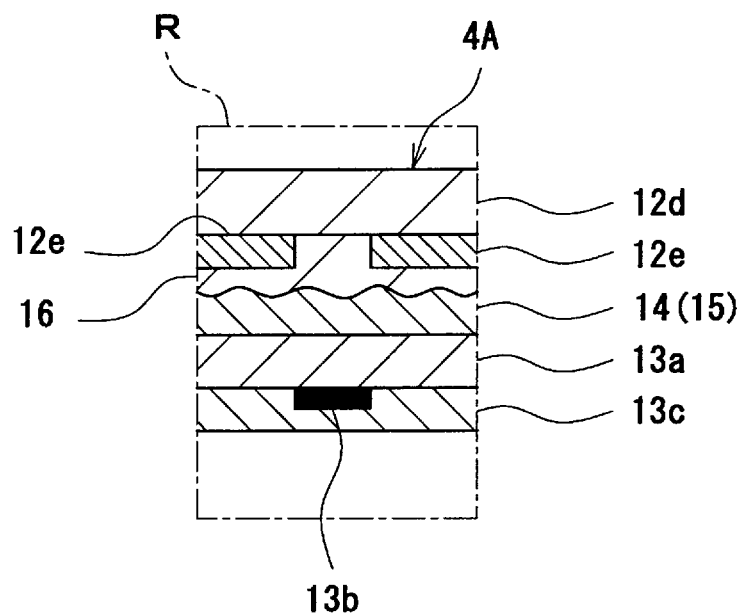
FIG. 23 is a diagram of sample 4A of the experimental example 1, corresponding to FIG. 16.

<Sample 4A>: A colored transparent light diffusing layer serving both as a colored transparent layer (14) and a light diffusing layer (15) was formed on a surface of a sensor sheet body (13a) opposite a surface on which a resist layer (13c) had been formed. As a filler for forming unevenness, the colored transparent light diffusing layer was configured mainly with polyester ink containing silica with a grain size of 2 μm in which the amount of black pigment was adjusted so that the transmittance of the dry film was about 2.0%. Other than the above was similar to sample 1A, and sample 4A with a configuration illustrated in FIG. 23 was obtained. The arithmetic surface roughness Ra of the surface of the resist layer (13c), the surface being an undersurface of sample 4A, was 0.21 μm.

Figure 24:
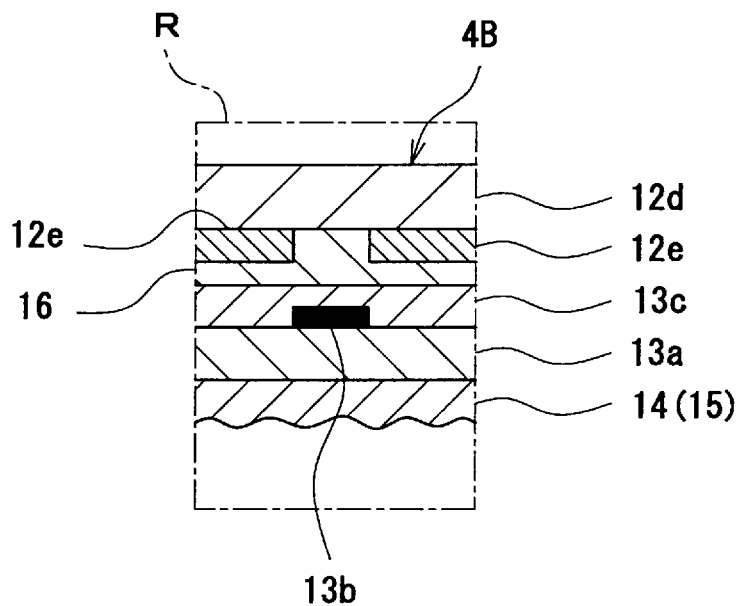
FIG. 24 is a diagram of sample 4B of the experimental example 1, corresponding to FIG. 16.

<Sample 4B>: Other than adhering, with a double-sided adhesive tape, a surface of a sensor sheet body (13a) to a surface provided with a resist layer (13c) to a molding 12, sample 4B configured in FIG. 24 was obtained in a manner similar to that of sample 4A. The arithmetic surface roughness Ra of the surface of the colored transparent light diffusing layer, the surface being an undersurface of sample 4B, was 0.58 μm.

Figure 25:
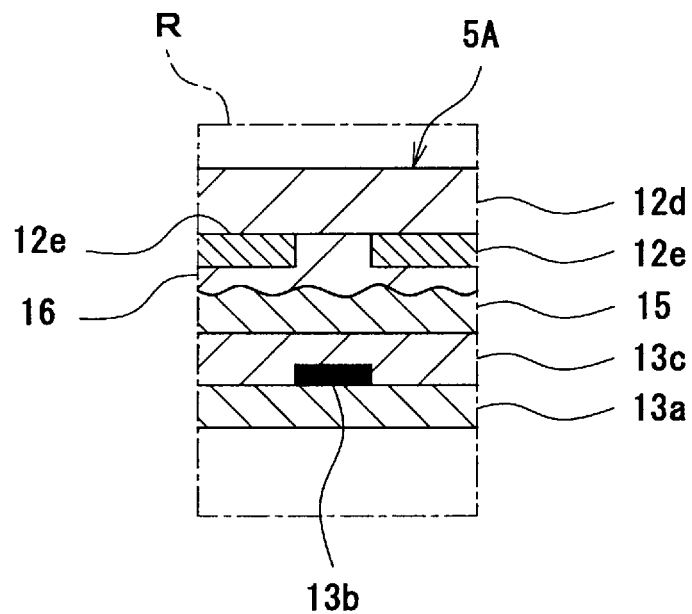
FIG. 25 is a diagram of sample 5A of the experimental example 1, corresponding to FIG. 16.

<Samples 5A and 5B>: Other than not forming a colored transparent layer (14) and other than adhering a light diffusing layer (15) to a molding (12), sample 5A with a configuration illustrated in FIG. 25 was fabricated in a manner similar to that of sample 1A.

Figure 26:
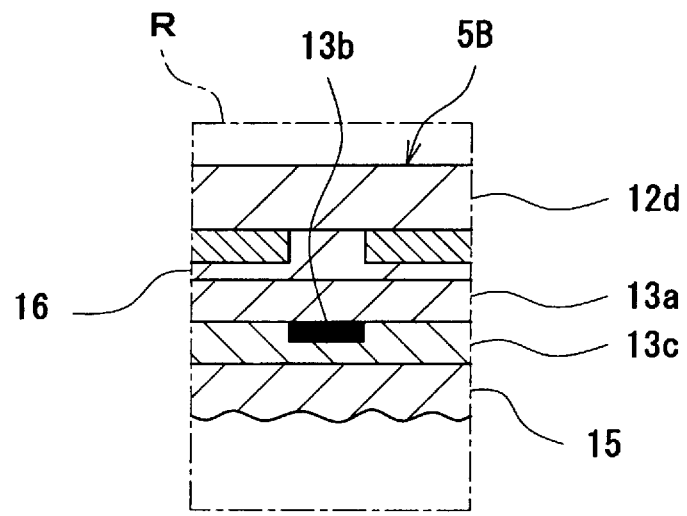
FIG. 26 is a diagram of sample 5B of the experimental example 1, corresponding to FIG. 16.

Furthermore, other than not forming the colored transparent layer (14) and other than adhering a side opposite to the side provided with the light diffusing layer (15) to a molding (12), sample 5B with a configuration illustrated in FIG. 26 was fabricated in a manner similar to that of sample 1A.

Figure 27:
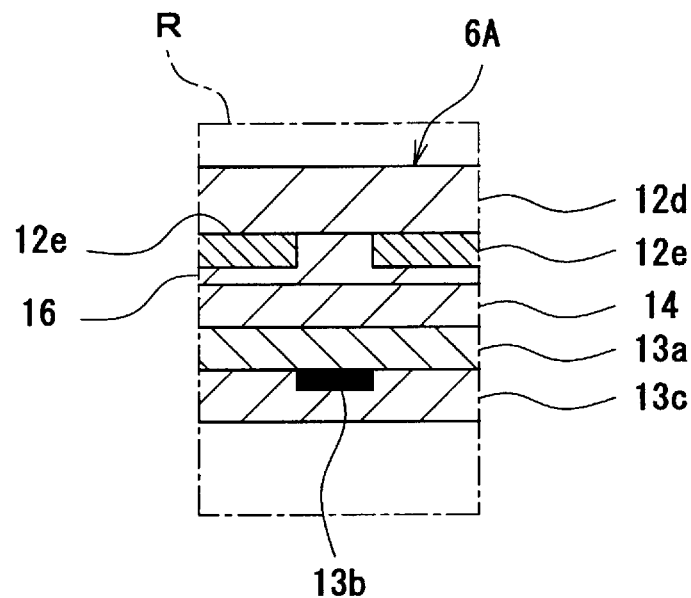
FIG. 27 is a diagram of sample 6A of the experimental example 1, corresponding to FIG. 16.

<Samples 6A and 6B>: Other than not forming a light diffusing layer (15), a sample 6A with a configuration illustrated in FIG. 27 was fabricated in a manner similar to sample 1A.

Figure 28:
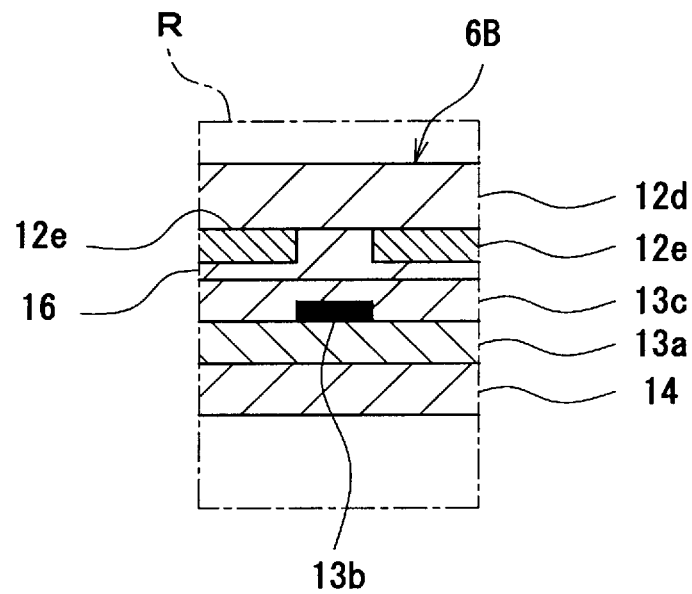
FIG. 28 is a diagram of sample 6B of the experimental example 1, corresponding to FIG. 16.

Furthermore, other than not forming the light diffusing layer (15) and other than adhering a side opposite to the side provided with the colored transparent layer (14) to a molding (12), sample 6B with a configuration illustrated in FIG. 28 was fabricated in a manner similar to that of sample 1A.

The layer compositions of samples 1A to 6B fabricated in the above manner are illustrated in a table in FIG. 29 (however, in FIG. 29, the sensor electrodes and the resist layers are omitted). Furthermore, evaluation results of the visibility and the light diffusion property described later are also illustrated in the table.

Figure 30:
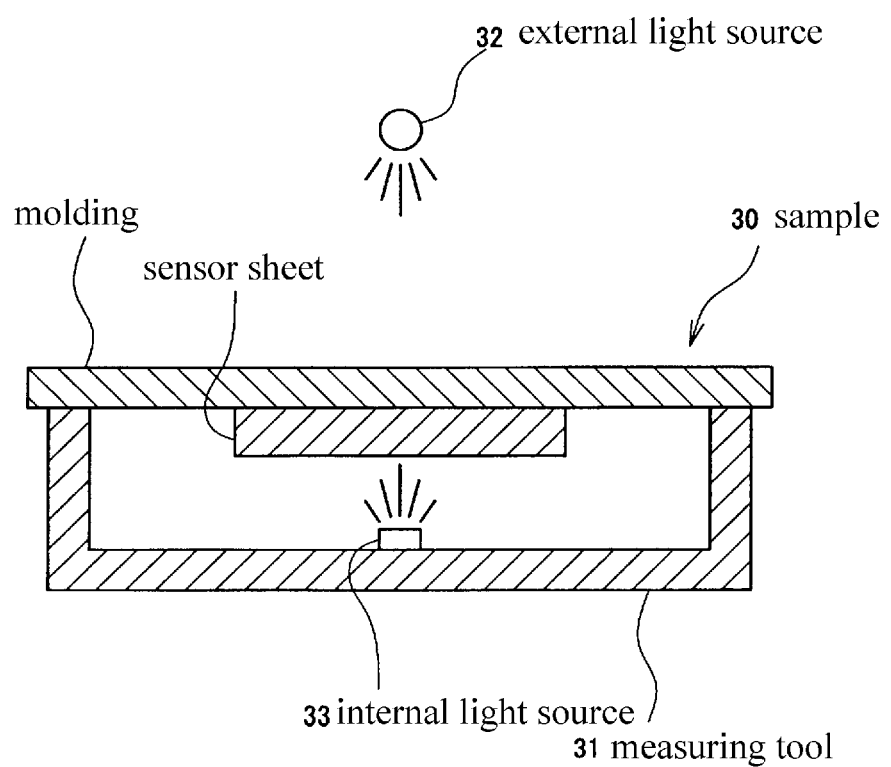
FIG. 30 is a schematic diagram of a testing machine for evaluating visibility and brightness.

<Evaluation of Visibility>: A schematic of laboratory equipment used in the measurement is illustrated in FIG. 30. A sample (30) was placed on a box-shaped measuring tool (31) formed of a light shielding material, and the difficulty in visually confirming the display elements (12c) when irradiated by a fluorescent light (an external light source (32)) from the upper surface side was evaluated in five grades. Specifically, "5" was when the display elements (12c) melted into the background and was not visually confirmed, "4" was when almost not visually confirmed while visually confirmed slightly depending on the angle and the like of the light, "3" was when it was difficult to perform visually confirmation, "2" was when it was easy to perform visual conformation, and "1" was when the display elements (12c) were especially easy to confirm visually.

Samples 6A 6B were "5". It was conceived that since the above samples did not include a light diffusing layer (15), no inconvenience, that is, the light diffusing layer (15) being visible through the display elements (12c), did not occur.

Evaluations of samples 1A, 2A, 3A, 4A, and 4B were "4". As for the above samples as well, the display elements (12c) were almost not capable of being visually confirmed and the results were favorable. Among the above, other than samples 4A and 4B, the colored transparent layer (14) was positioned on a surface above the light diffusing layer (15). With the above, it was considered that the display elements (12c) do not stand out against the background when the configuration is such that the colored transparent layer (14) conceals the light diffusing layer (15). Furthermore, in the case of samples 4A and 4B, since the light diffusing layer (15) itself is colored, it was considered that light diffusion of the light incident on the upper surface of the display element was suppressed.

Evaluations of samples 1B, 2B, 3B, and 5A were "3". As for the above samples, while the display elements (12c) did slightly stand out and was visible, visual confirmation was difficult and the difference with "4" was slight. It was considered that the concealing effect was not exerted since the samples other than sample 5A commonly had the light diffusing layer (15) positioned on a surface above the colored transparent layer (14). However, in the case of samples 1B and 3B, the surface of the light diffusing layer (15) and the molding (12) were adhered to each other with a double-sided adhesive tape, and a state in which the adhesive entering into the unevenness of the light diffusing layer (15) diminishing the light diffusing effect was seen. The same applied for sample 5A as well. On the other hand, as for sample 2B, while the colored transparent layer (14) is layered on the uneven surface of the light diffusing layer (15), the effect of diffusing the light from the upper surface was suppressed in the sample as well. It was considered that since the transmittance of the light diffusing layer (15) of each sample was 4.0% and was high, the display elements (12c) were difficult to see in the samples in which the diffuse reflection was suppressed in the above described manner.

The evaluation of sample 5B was "1". In the above sample, the light diffusing layer (15) was seen to reflect the light from the upper surface and the display elements (12c) were capable of being visually confirmed.

<Evaluation of Light Diffusion Property>: The measuring tool (31) used to evaluate the visibility was used and an LED (an internal light source (33)) disposed therein was turned on to evaluate the uniformity of the light of the display elements (12c) when viewed from the upper surface. Particularly, all of the samples were relatively classified into five grades in which "5" is a grade in which light is diffused to the extent not allowing the external form of the LED, which is a point light source, to be perceived, and "1" is a grade in which there is no light diffusing effect.

The evaluation of samples 1A and 5B were "5". In the above samples, the light diffusing layer (15) was exposed at the undersurface of the sample, and the arithmetic average surface roughness Ra was, compared to other samples, a relatively large value of 0.63 μm. It was considered that a favorable light diffusion property was revealed because of the above.

The evaluation of samples 3A and 4B were "4". In sample 3A, the light diffusing layer (15) was exposed at the undersurface, and the arithmetic average surface roughness Ra was 0.46 μm. Meanwhile, in sample 4B, the colored transparent light diffusing layer (15) was exposed at the undersurface, and the arithmetic average surface roughness Ra was 0.58 μm. Compared with sample 1A, while the Ra value was slightly low, it was considered that a sufficient light diffusing effect was obtained with the unevenness of the undersurface.

Next, the evaluation result of sample 2B was "3". The undersurface of sample 2B was configured such that the colored transparent layer (14) was layered on the light diffusing layer (15), and the light diffusing layer (15) was not exposed. However, the colored transparent layer (14) did not fill the unevenness of the light diffusing layer (15) and the arithmetic average surface roughness Ra was 0.34 μm. Furthermore, since the transmittance of the colored transparent layer (14) was relatively high and was 50%, a certain light diffusing effect was obtained.

Evaluations of samples 1B, 2A, 4A, and 5A were "2". The samples were commonly disposed with the light diffusing layer (15) on the upper surface of the sensor sheet (13) and the surface thereof and the molding (12) were adhered to each other with a double-sided adhesive tape. Actually, the unevenness of the light diffusing layer (15) of each sample was filled with the double-sided adhesive tape, and almost all of the light diffusing effect was lost. Furthermore, the arithmetic surface roughness Ra of the surface of the resist layer (13c) constituting the undersurface was 0.21 μm, and the diffusing effect of the surface was could not be confirmed.

As for samples 6A and 6B that do not have the light diffusing layer (15), there were no light diffusing effects and the evaluation was "1".

It seemed from the above results that there is a correlation between the light diffusion property and the size of the arithmetic average roughness. Since the samples that have an arithmetic average roughness of 0.21 μm are evaluated as "2" and, on the other hand, sample 2B having an arithmetic average roughness of 0.34 μm showed a certain light diffusing effect, it was considered that it is preferable that the value of the arithmetic average surface roughness is about 0.30 μm or larger.

Considering the evaluations of the visibilities and the evaluations of the light diffusion properties above, sample 1A had the properties of both of the above at a high level, and samples 3A and 4B had subsequent good results. Furthermore, sample 2B in which the evaluations were both 3 or higher can be said to have gained the pass mark. As for the other samples, either one was 2 or under and did not satisfy the requirements.

Experimental Example 2

An experiment was conducted to explore the effect the transmittance of the colored transparent layer (14) has on the degree of blackout, and the degree of brightness when the light is on.

The samples used in the experimental example 2 was fabricated in the following manner. Black polyester inks that do not have a light diffusion property and that were prepared to have various transmittances illustrated in FIG. 31 were printed on transparent polyethylene telephthalate resin films (base sheets 13a). The degree of transmittance was adjusted by the mixing ratio of a medium (transparent) colored ink and a black colored ink. Subsequently, the light diffusing layer (15) was further printed on the above colored transparent layer (14). Two types of light diffusing layers (15) were prepared, and a light diffusing layer (A) was formed using the same polyester ink used in the experimental example 1 containing silica having a grain size of 2 μm and serving as a filler for forming the unevenness. Furthermore, for comparison, a light diffusing layer (B) was formed using a white ink. The transmittance of the light diffusing layer (A) alone was 4.0% and the transmittance of the light diffusing layer (B) alone was 0.3%. Furthermore, by adhering the above layer films to the molding (12) that is similar to that in the experimental example 1 with a double-sided tape, samples for evaluation were obtained. Furthermore, together with the evaluations of the visibilities and evaluations of the brightness of illumination, the samples for evaluation are illustrated in FIGS. 31 and 32.

<Evaluation of Visibility>: The evaluation criteria of visibility was similar to that of the experimental example 1. In combination with the light diffusing layer (A), when the transmittance of the colored transparent layer (14) was 70% or lower, visual confirmation of the display elements (12c) could be made difficult, and, in particular, when 50% or lower, visual confirmation was almost not possible and the result was favorable. On the other hand, in the case of the sample that used the light diffusing layer (B), even when the transmittance of the colored transparent layer (14) was 3%, the white color of the foundation stood out and, consequently, the display elements (12c) were visually confirmed easily.

<Evaluation of Brightness>: Regarding the brightness of the illumination, "◯" was when with sufficient brightness, "Δ" was when it was somewhat bright, and "x" was when it looked dark. In combination with the light diffusing layer (A), the brightness was sufficient when the transmittance of the colored transparent layer (14) was 10% or higher. Furthermore, when the transmittance of the colored transparent layer (14) was 20% or higher, a decrease in the brightness of the colored transparent layer (14) was slight. Conversely, in combination with the light diffusing layer (B), when the transmittance of the colored transparent layer (14) was 35%, the brightness was substantially similar to the brightness of the light diffusing layer (A) at 10%. Note that regarding the light diffusing layer (A) and the light diffusing layer (B), the sample using the light diffusing layer (A) was more uniform in illuminance, and the light diffusing layer (A) was superior in the light diffusion property.

Accordingly, in the light diffusing layer (A), when the transmittance of the colored transparent layer (14) was 10% or higher to 70% or lower, while it was possible to emit light in a uniform and bright manner when the light was on, the display elements (12c) melted into the background and was difficult to see when the light was not on. Furthermore, especially when the transmittance of the colored transparent layer (14) was in the range of 20% or higher to 50% or lower, both the difficulty in visually confirming the display elements (12c) when the light is not on, and the brightness when the light is on were achieved at high levels. On the other hand, in the light diffusing layer (B), a configuration satisfying both the difficulty in visually confirming the display elements (12c) when the light is not on, and the brightness when the light is on were not obtained.

REFERENCE SIGNS LIST 11 control panel
12 molding
12a inner surface
12b window
12c display element
12d body
12e light shielding layer 12f through hole
13 sensor sheet
13a sensor sheet body
13b sensor electrode
13c resist layer
13d wiring
13e terminal
14 colored transparent layer
15 light diffusing layer
16 adhesion layer
21 display panel
30 sample
31 measuring tool
32 external light source (fluorescent light)
33 internal light source (LED)

The invention claimed is:

1. An input component comprising:
a molding having a molding body exposed outside and a light shielding layer in direct contact with and laminated on an inner surface of the molding body except for portions where display elements are located which are illuminated when the internal light source is on, so as to shield a light of the internal light source;
a sensor sheet attached to an inside of the molding, the sensor sheet including
a sensor sheet body formed of a resin film,
a sensor electrode formed on a first surface of the sensor sheet body; and
an adhesion layer attached to the molding and the sensor sheet;
a colored transparent layer provided on the molding or the sensor sheet; and
a light diffusing layer, is either of a coating layer and a printing layer, formed on a second surface of the sensor sheet body opposite from the first surface,
wherein the colored transparent layer formed in a color tone that creates a blackout in which the display elements become integrated with the light shielding layer and are not easily viewed when the internal light source is turned off.

2. The input component according to claim 1, wherein a transmittance of the colored transparent layer is 10% or higher to 70% or lower.

3. The input component according to claim 1, wherein a transmittance of the light diffusing layer is 2.0% or higher.

4. The input component according to claim 1, wherein an arithmetic average roughness Ra of an unevenness of the surface of the light diffusing layer is 0.3 μm or larger.

5. The input component according to claim 1, wherein the light diffusing layer is also a colored transparent layer.

6. The input component according to claim 1, wherein the colored transparent layer is positioned over the light diffusing layer.

7. The input component according to claim 1, wherein a transmittance of the colored transparent layer is 20% or higher to 50% or lower.

8. The input component according to claim 1, wherein the colored transparent layer is provided to be located under the light diffusing layer, and a lower surface, facing the light source, of a colored light transmitting layer is uneven.

9. The input component according to claim 1,
wherein the molding body is the colored transparent layer.

10. The input component according to claim 1,
wherein a color tone of the colored transparent layer is the same as a color tone of the light shielding layer.

11. The input component according to claim 1,
wherein the colored transparent layer is provided on the first surface.

12. The input component according to claim 1,
wherein the colored transparent layer is provided on a surface above the light shielding layer.

13. The input component according to claim 1,
wherein the molding body is provided with the light shielding layer and the colored transparent layer.

14. An input component comprising:
a molding having a body exposed outside and a light-shielding colored resin formed with a plurality of through holes that form display elements which are illuminated when an internal light source is on, so as to shield a light of the internal light source;
a sensor sheet attached to an inside of the molding, the sensor sheet including
a sensor sheet body formed of a resin film,
a sensor electrode formed on a first surface of the sensor sheet body; and
an adhesion layer attached to the molding and the sensor sheet;
a colored transparent layer provided on the molding or the sensor sheet; and
a light diffusing layer, is either of a coating layer and a printing layer, formed on a second surface of the sensor sheet body opposite from the first surface,
wherein the colored transparent layer formed in a color tone that creates a blackout in which the display elements become integrated with the light-shielding colored resin and are not easily viewed when the internal light source is turned off.

* * * * *